United States Patent
Wetz et al.

(10) Patent No.: US 6,796,482 B2
(45) Date of Patent: Sep. 28, 2004

(54) PHASE SEPARATED SYSTEM FOR FLUXING

(75) Inventors: Li Ann Wetz, Chandler, AR (US); Treliant Fang, Chandler, AR (US)

(73) Assignee: Freescale Semiconductor, Inc., Schaumburg, IL (US)

(*) Notice: Subject to any disclaimer, the term of this patent is extended or adjusted under 35 U.S.C. 154(b) by 0 days.

(21) Appl. No.: 10/286,438

(22) Filed: Oct. 31, 2002

(65) Prior Publication Data

US 2004/0084510 A1 May 6, 2004

(Under 37 CFR 1.47)

(51) Int. Cl.[7] .......................... B23K 1/20; B23K 31/02; B23K 35/34; C23C 30/00
(52) U.S. Cl. ...................... 228/207; 228/208; 228/223; 228/224; 148/22; 148/23
(58) Field of Search .................. 228/207, 208, 228/214, 223, 224; 148/22, 23

(56) References Cited

U.S. PATENT DOCUMENTS

| | | | | |
|---|---|---|---|---|
| 4,218,248 A | * | 8/1980 | Snyder et al. | ............. 106/1.12 |
| 4,541,876 A | * | 9/1985 | Hwang | ....................... 148/22 |
| 4,950,623 A | | 8/1990 | Dishon | ....................... 437/183 |
| 5,145,722 A | | 9/1992 | Kaspaul | |
| 5,162,257 A | | 11/1992 | Yung | ........................... 437/183 |
| 5,571,340 A | | 11/1996 | Schneider et al. | |
| 6,059,894 A | | 5/2000 | Pendse | |
| 6,265,776 B1 | * | 7/2001 | Gilleo | ........................ 257/738 |
| 6,316,528 B1 | * | 11/2001 | Iida et al. | .................... 523/428 |
| 2002/0063146 A1 | | 5/2002 | Bernier, et al. | |
| 2002/0195171 A1 | * | 12/2002 | Li et al. | ....................... 148/25 |
| 2003/0111519 A1 | * | 6/2003 | Kinney et al. | ............... 228/223 |

FOREIGN PATENT DOCUMENTS

| | | |
|---|---|---|
| EP | 0 423 286 B | 9/1994 |
| WO | WO 2004/011190 A1 | 2/2004 |

OTHER PUBLICATIONS

Indium Corporation of America. Product Data Sheet. SMQ TACFLUX for BGA and Surface Mount Component Reflow and Repair, 2 pp.

* cited by examiner

*Primary Examiner*—L. Edmondson
(74) *Attorney, Agent, or Firm*—Hulsey Grether Fortkort LLP; John Fortkort

(57) ABSTRACT

A solder flux composition (19) is provided which comprises active ingredients and a carrier. The solder flux composition undergoes a phase separation during solder reflow to form at least a first phase (21) and a second phase (23), such that the active ingredients are disposed primarily in the first phase and the carrier is disposed primarily in the second phase. The use of this solder flux composition is found to reduce solder migration, during solder reflow, that can result in bridging in ball grid arrays and other such devices.

37 Claims, 2 Drawing Sheets

PHASE SEPARATED SYSTEM FOR FLUXING

FIELD OF THE INVENTION

The present invention relates generally to solder flux compositions, and more particularly to solder flux compositions useful for attaching solder to a substrate or motherboard.

BACKGROUND OF THE INVENTION

Various solder flux compositions are used in the soldering of electronic components, circuits, equipment and the like so as to improve the efficiency and quality of the soldering operation and to improve the long-term reliability of solder joints. Solder flux compositions are often designed to react with or dissolve metal oxides and impurities commonly present on the surfaces being soldered, and to coat the cleaned surfaces to protect them against oxidation.

The use of solder flux compositions in soldering operations that involve devices having finer features (about 1.0 mm or smaller), such as fine-pitched Ball Grid Arrays (BGAs), places great demands both on the solder flux composition itself and on its method of application. Because of the dimensions involved, devices of this type have very small tolerances for error in terms of the placement of a solder joint. Consequently, if the solder migrates even slightly from its original intended position on the substrate during reflow, electrical bridging can occur between neighboring solder joints, thereby resulting in a defective product.

In some applications, the use of a stencil during the application of a solder flux composition can help to minimize bridging problems by limiting the area to which the solder flux composition is applied, thereby limiting the area over which solder migration tends to occur. However, the use of a stencil as the primary means to control solder migration is not equally effective for all solder fluxes. In particular, while many solder flux compositions have relatively high viscosities at room temperature, some solder flux compositions become substantially less viscous at higher temperatures, and thus tend to migrate from their original placement during reflow. In soldering operations that employ solder flux compositions of this type, the use of a stencil as the primary means to control solder migration with these solder flux compositions may be largely ineffective.

The use of a stencil as the primary means to control solder migration may also be ineffective in soldering operations that involve items, such as fine-pitched BGAs, that have very small features. This may be the case even if the solder flux composition retains a relatively high viscosity at reflow temperatures since, in applications of this type, even small migrations of the solder flux composition from its original position may result in bridging problems. For example, many solder flux compositions perform adequately on medium-pitched substrates (that is, substrates in which the pitch—that is, the distance between the midpoints of adjacent bond pads on the substrate—is about 1.27 mm, a standard pitch for many flip-chip BGAs), but result in substantial bridging on finer pitched substrates (for example, on substrates having a pitch of 1.0 mm or smaller). Unfortunately, the ongoing trend in the art toward further miniaturization of device features has resulted in increasing usage of finer pitched substrates, thus creating an increasing need for flux compositions that are more effective at limiting solder migration.

A further issue in the art arises from the desire to replace lead-based solders with lead-free solders. In many applications, the use of lead-free solders is not only desirable, but has become a requirement. Unfortunately, it has been found that many solder flux compositions which perform adequately with lead-based solders do not perform well with lead-free solder compositions (especially on finer-pitched substrates), frequently resulting in substantial bridging problems.

There is thus a need in the art for a solder flux composition, and for a method of applying and using the same, that can be used for ball attach operations on fine-pitched BGAs or in other solder operations involving small feature sizes. There is also a need in the art for a solder flux composition which minimizes the bridging problems that can occur as a result of the migration of solder flux compositions, especially on fine-pitched substrates. There is further a need in the art for a solder flux composition which performs well with lead-free solders. These and other needs are met by the compositions and methodologies described herein.

SUMMARY OF THE INVENTION

In one aspect, a solder flux composition is provided herein which comprises active ingredients and a carrier. The composition undergoes a phase separation at a temperature greater than about 100° C., preferably greater than about 150° C., more preferably greater than about 175° C., and most preferably greater than about 200° C., to form at least a first phase and a second phase, wherein the active ingredients are disposed primarily in said first phase, and wherein the carrier is disposed primarily in said second phase. The solder flux composition preferably comprises active ingredients, a masking agent, a carrier, and a solvent. The active ingredients typically comprise a carboxylic acid, and preferably comprise phenylsuccinic acid. The masking agent preferably comprises 2-ethylimidazole. The carrier preferably comprises polyethylene glycol, and the solvent preferably comprises a polypropylene glycol butyl ether such as polypropylene glycol monobutyl ether, or tripropylene glycol.

In another aspect, a method for reflowing solder is provided. In accordance with the method, a substrate is provided, which may be, for example, a medium or fine-pitched BGA. A solder flux composition (which may be of the type described above) is then applied to the substrate. The solder flux composition comprises active solder flux ingredients disposed in a carrier. The substrate may comprise a plurality of bond pads, each of which may have a metallization layer disposed thereon, and the solder flux composition may be selectively applied to the substrate with the aid of a stencil such that the solder flux composition is disposed primarily over said plurality of bond pads. A solder is then applied to the substrate that has been treated with the solder flux composition, and the solder is reflowed. During reflow, which preferably involves the step of heating the solder to a temperature greater than 200° C., the solder flux composition undergoes a phase separation. Preferably, this phase separation results in the production of a first liquid phase which consists principally of the carrier, and a second phase which consists principally of the active ingredients of the solder flux composition.

In yet another aspect, a method for preparing a substrate, such as a fine-pitched BGA, for a ball attach operation is provided. In accordance with the method, a substrate is provided which has a first surface with a plurality of bond pads disposed thereon. A portion of a solder flux composition, which comprises a solder flux disposed in a carrier, is then applied to each bond pad, thereby forming a treated bond pad. Solder is then applied to the treated bond pad and is reflowed. The solder flux composition is adapted to undergo a phase separation during the reflow of the solder.

In still another aspect, a solder flux composition is provided which comprises phenylsuccinic acid, ethylimidazole, polyethylene glycol, at least one alkylene glycol butyl ether, and a thixotropic agent, and wherein the amount of ethylimidazole present in the solder flux composition is less than 5.4% by weight, based on the total weight of the solder flux composition. The at least one alkylene glycol butyl ether may comprise one or both of polypropylene glycol butyl ether and tripropylene glycol butyl ether. The amount of ethylimidazole present in the solder flux composition is preferably within the range of about 2.0 to about 5.2%, more preferably within the range of about 3.5 to about 5.0%, and most preferably within the range of 3.7 to 5.1% by weight, based on the total weight of the solder flux composition. The amount of phenylsuccinic acid present in the solder flux composition is preferably within the range of about 2 to about 20%, more preferably within the range of about 8 to about 16%, and most preferably within the range of about 10 to about 15.5% by weight, based on the total weight of the solder flux composition. The amount of polyethylene glycol present in the solder flux composition is preferably within the range of about 1 to about 20%, and more preferably within the range of about 3 to about 16% by weight, based on the total weight of the solder flux composition. The amount of the at least one alkylene glycol butyl ether is preferably within the range of about 50 to about 80%, and more preferably within the range of about 60 to about 70% by weight, based on the total weight of the solder flux composition. The amount of thixotropic agent present in the solder flux composition is preferably within the range of about 2 to about 20%, and more preferably within the range of about 3 to about 15% by weight, based on the total weight of the solder flux composition. The thixotropic agent is preferably a wax such as beeswax.

In one particular embodiment, the amount of polyethylene glycol present in the solder flux composition is within the range of about 10 to about 20% by weight, based on the total weight of the solder flux composition, and the polyethylene glycol has an average molecular weight within the range of about 600 to about 1200 g/mol.

In another particular embodiment, the amount of polyethylene glycol present in the solder flux composition is within the range of about 10 to about 20% by weight, based on the total weight of the solder flux composition, and the polyethylene glycol has an average molecular weight within the range of about 500 to about 1500 g/mol, and preferably about 900 g/mol. In yet another particular embodiment, the solder flux composition comprises about 2 to about 20% phenylsuccinic acid, about 2.0 to about 5.2% ethylimidazole, about 1 to about 20% polyethylene glycol, about 50 to about 80% of at least one alkylene glycol butyl ether, and about 2 to about 20% thixotropic agent, wherein all percentages are percentages by weight, based on the total weight of the solder flux composition.

In still another particular embodiment, the solder flux composition comprises about 8 to about 16% phenylsuccinic acid, about 3.5 to about 5.0% ethylimidazole, about 3 to about 16% polyethylene glycol, about 60 to about 70% of at least one alkylene glycol butyl ether, and about 3 to about 15% thixotropic agent, wherein all percentages are percentages by weight, based on the total weight of the solder flux composition.

These and other aspects of the present disclosure are described in greater detail below.

DETAILED DESCRIPTION

Definitions

As used herein, the term "solder flux composition" refers to a solder flux disposed in a carrier.

As used herein, the term "solder flux" refers to the active ingredients of a solder flux composition (that is, the ingredients in the solder flux composition which, upon application to a metal, react with the metal to prepare it for application of a solder).

As used herein, the term "carrier" refers to a solvent and/or medium for a solder flux; the carrier is typically essentially inert to most metals.

As used herein, the term "pitch", when used in reference to a substrate, refers to the distance between the midpoint of adjacent bond pads on the substrate.

As used herein, the term "bridging" refers to the phenomenon wherein the solder on adjacent bond pads coalesces upon reflow into a single larger solder ball that spans both bond pads.

As used herein, the term "robbing" refers to the phenomenon wherein the solder on one bond pad coalesces with the solder on an adjacent bond pad during reflow to form a single larger solder ball centered on the adjacent bond pad.

Overview

The present Applicants have made the surprising discovery that solder bridging and robbing can be reduced or eliminated through the use of a solder flux composition that undergoes a phase separation under the conditions experienced during solder reflow. Without wishing to be bound by theory, it is believed that the phase separation results in a situation in which the active flux ingredients are disposed primarily in a first phase which is disposed principally between the metal bond pad of a substrate and the solder ball (or portion of solder) disposed over the bond pad, and in which the carrier is disposed primarily in a second phase which is disposed between adjacent solder balls (or portions of solder). It is further believed that the carrier, which is inert to the solder, helps to prevent bridging or robbing during reflow by forming a phase between adjacent solder balls (or portions of solder) that does not promote bridging or robbing. Moreover, since the active portion of the solder flux composition is constrained primarily to the area of the underlying bond pad, it is prevented from contributing to bridging or robbing problems during solder reflow.

Figure 1:
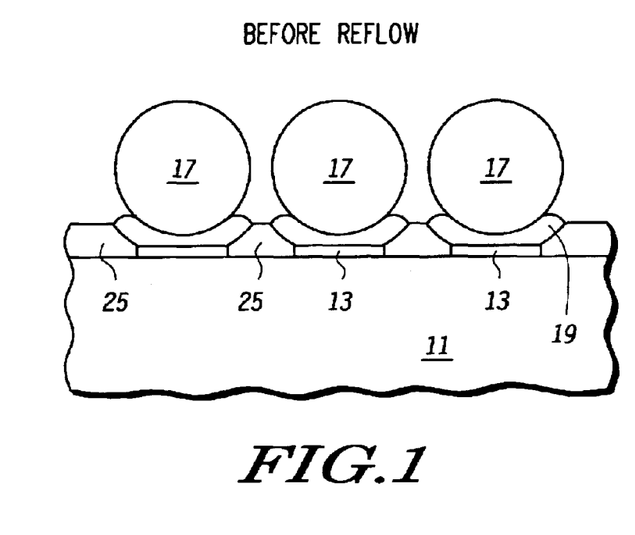
FIGS. 1 and 2 are illustrative drawings depicting the phase separation of solder compositions during solder reflow.
Figure 2:
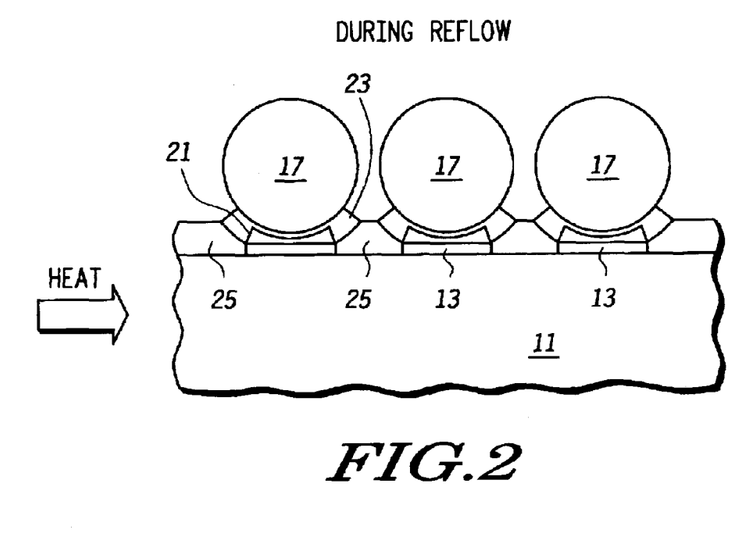

FIGS. 1 and 2 depict, in the context of a typical ball attach operation, the effect of solder reflow on the solder flux compositions described herein. The device of FIGS. 1 and 2 consists of a substrate 11 upon which is disposed a series of bond pads 13. Each bond pad has a portion of solder 17 disposed thereon. While the solder is depicted here as a solder ball, it is to be understood that, at least prior to reflow, the solder could be present as a powder, dispersion, or article formed by an electroplating process, and hence could have a shape that is not necessarily spherical or hemispherical.

As shown in FIG. 1, prior to solder reflow, the solder flux composition 19 exists as an essentially homogeneous mixture of solder flux and carrier which is disposed underneath each solder ball and in the area around the solder ball bounded by the adjacent solder mask 25. However, during reflow, the solder flux composition undergoes a phase separation to produce a first phase 21 which is disposed primarily between the solder ball and the underlying bond pad and which contains the active ingredients of the solder flux composition, and a second phase 23 which is disposed primarily between the solder balls and the adjacent solder mask 25 and which contains the bulk of the carrier. Indeed, in many embodiments, the second phase will consist essentially of the carrier. Since the solder is not attracted to the carrier but is attracted to the fresh metal surface exposed by the solder flux, the disposition of the separate phases of the solder flux composition as shown in FIG. 2 creates a situation in which the solder tends to remain over the bond pads during reflow. In particular, the inert carrier acts as somewhat of a barrier between adjacent solder balls that prevents (or at least does not promote) bridging, while at the same time having the effect of confining the active ingredients of the solder flux composition to an area in the vicinity of the bond pads where they will not contribute to solder migration.

Several possibilities exist for the various features, aspects and components of the compositions and methodologies described herein. Some of these possibilities are described in greater detail below.

Application of Solder Flux Composition

The solder flux compositions disclosed herein may be applied to a metal surface by a variety of techniques, including foaming, wave fluxing, spraying, pin transfer, stamp-transfer, brushing, rolling, dipping, screen printing, and combinations of these methodologies. However, it is preferred that these compositions are applied selectively to the intended surface so that each portion of the solder flux composition is spaced apart from each other portion of solder flux. Preferably, the solder flux composition is applied only in the vicinity of the bond pads.

Figure 3:
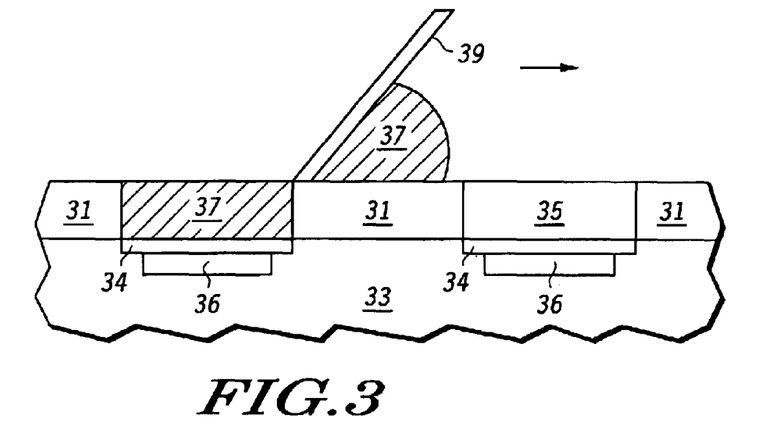
FIGS. 3–5 are illustrative drawings of a method for applying a solder flux composition to a substrate.
Figure 4:
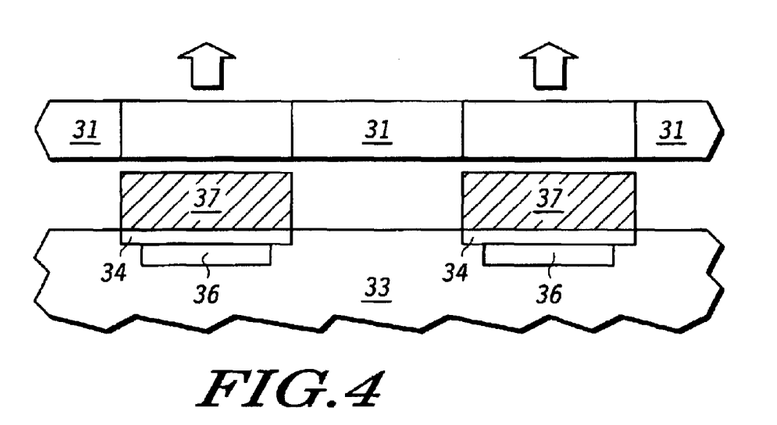
Figure 5:
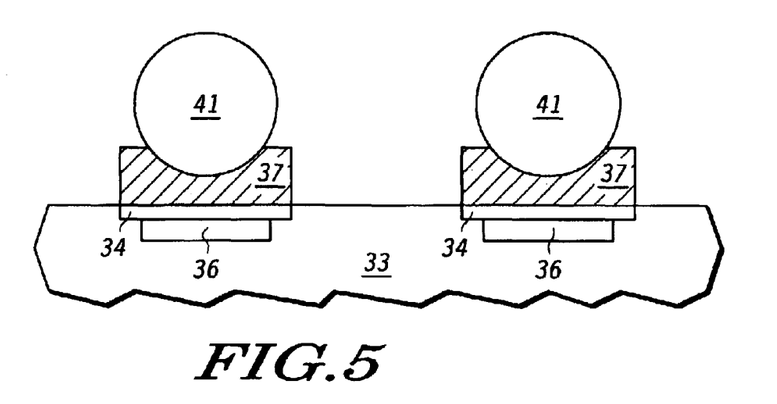

The selective application of the solder flux composition to a substrate may be achieved, for example, through the use of a template. FIGS. 3–5 illustrate one possible implementation of this type of approach. In accordance with this methodology, as shown in FIG. 3, a stencil 31 is applied to a substrate 33. The stencil is equipped with a plurality of apertures 35 adapted to receive a solder flux composition. These apertures are spaced apart so as to direct the solder flux composition onto the under bump metallization (UBM) 34 which is disposed over the bond pads 36 present on the substrate (if no UBM were present, the apertures would be spaced so as to direct the solder flux composition onto the bond pads).

As shown in FIG. 3, the solder flux composition 37 is then applied across the template using a squeegee 39 or other means of application. As shown in FIG. 4, after the solder flux composition 37 has been applied, the stencil 31 is removed, with the effect that the solder flux composition is applied only in the vicinity of the apertures.

FIG. 5 depicts the solder composition 41 after it has been positioned onto the solder flux composition 37. The positioning of the solder composition may be achieved through various methods. Thus, for example, the solder may be positioned over the bond pads as a solid mass, as through the use of a stencil, a vacuum head (this would typically be used with a pattern matching the bond pad pattern), or by other suitable means, or may be plated onto the bond pads (in which case, the solder flux composition would be applied onto the solder composition rather than the bond pads or UBM).

Application of Solder Flux Composition and Solder

The solder compositions used in combination with the solder flux compositions disclosed herein may be applied through a variety of techniques, including drop dispensing and wave soldering. The solder compositions may be applied as unitary masses (e.g., as spherical, hemispherical or rounded pellets), as a paste or powder, or as an electroplated layer. Typically, the solder composition will assume a rounded or spherical profile upon reflow, due to the surface tension of the composition.

Organic Acids

A variety of acids may be used as the active ingredients of the solder flux compositions described herein. The acids utilized are typically effective, either alone or in combination with other acids, at removing metal oxides or debris from the metal surface that the solder joint is to be adhered to, thereby yielding a clean, oxide-free surface for the solder joint, and hence may serve as the active ingredients of the solder flux composition. Depending on the specific application, the acid(s) may also be chosen to yield a solder flux composition that is sufficiently volatile so as to leave little or no residue after application or reflow, or to yield a water cleanable residue or a residue that is inert or harmless (e.g., non-corrosive) to the substrate or to components of the device to which they are applied.

The acids used in various embodiments of the solder flux compositions described herein are preferably organic acids, and even more preferably carboxylic acids. Suitable carboxylic acids may be monocarboxylic acids, dicarboxylic acids, or polycarboxylic acids. Specific examples of such carboxylic acids include formic acid, acetic acid, propionic acid, abietic acid, valeric acid, caproic acid, phenylacetic acid, benzoic acid, aminobenzoic acid, succinic acid, glutaric acid, adipic acid, oxalic acid, malonic acid, pimelic acid, suberic acid, azelaic acid, sebacic acid, citric acid, tartaric acid, oleic acid, stearic acid, linoleic acid, mandelic acid, glyceric acid, glycolic acids; enanthic acid, capric acid, pelargonic acid, lauric acid, myristic acid, palmitic acid, arachic acid, behenic acid, acrylic acid, methacrylic acid, fumaric acid, maleic acid, levulinic acid, 12-hydroxystearic acid, benzoic acid, anisic acid, anthranilic acid, naphthalenecarboxylic acid, pimellic acid, dodecanedioic acid, eicosanedioic acid, phthalic acid, isophthalic acid, naphthalenedicarboxylic acid, diphenylsulfonedicarboxylic acid, diphenylmethanedicarboxylic acid, trimellitic acid, trimesic acid, pyromellitic acid, butane-1,2,3,4-tetracarboxylic acid, and rosin. Various fatty acids, some of which have already been noted above, may also be utilized in some embodiments of the solder flux compositions described herein. Of these various acids, the use of phenylsuccinic acid (PSA) is especially preferred.

Various non-carboxylic acids may also be used in various embodiments of the solder flux compositions described herein. For example, p-toluenesulfonic acid, 5-sulfosalicylic acid, 4-sulfophthalic acid, and sulfanilic acid may be useful in certain applications.

Various mixtures based on two or more of the foregoing acids may also be used in the solder flux compositions described herein. For example, mixtures of adipic acid, ortho-hydroxybenzoic acid (salicylic acid) and para-hydroxybenzoic acid may be used. With proper selection of the component acids and/or a liquid medium, a mixture may be achieved that has a boiling point which is lower than the boiling points of some or all of the mixture's components, thus facilitating removal of the solder flux composition during solder reflow.

If desired, the components of the solder flux composition may be selected to avoid sublimation, which can result in the condensation of acid on surface areas adjacent to the solder joint. Sublimation may also be avoided through other means such as, for example, through the use of a proper solvent medium or carrier.

Solvents and Liquid Media

A variety of solvent systems and liquid media may be employed in the solder flux compositions described herein. In some embodiments, a single material may be used as the solvent or liquid medium for the solder flux composition. In other embodiments, mixtures of materials may be employed as the solvent or liquid medium for the solder flux composition. In still other embodiments, the solvent system or liquid medium may include a carrier such as polyethylene glycol which prevents the acids in the solder flux composition from volatilizing, and a main component, such as polypropylene glycol monobutyl ether, which may act as a general solvent for the solder flux and/or carrier. The general solvent is preferably capable of dissolving both the active ingredients of the solder flux composition and the carrier, it being understood that the general solvent may not dissolve all of the active components of the solder flux composition completely (one example of such incomplete solvation would include a supersaturated solution). In some embodiments, the solvent system or liquid medium may also include low boiling components that may be driven off early in a soldering or solder reflow process, and high boiling components that may be retained in the solder flux composition until later in a soldering or solder reflow process.

Useful components of the solvent systems and liquid media employed in the solder flux compositions described herein may include, for example, alcohols such as, for example, methanol, ethanol, isopropyl alcohol, n-propyl alcohol, n-butyl alcohol, sec-butyl alcohol, or higher boiling aliphatic or cycloaliphatic alcohols, such as, for example, tetrahydrofurfuryl alcohol. Suitable alcohols may also include other volatilizable aliphatic or cycloaliphatic alcohols, especially those in which the components of the solder flux composition are at least partially soluble.

Polyols (including glycols), including those with ester or ether linkages, are especially useful in the solvent systems and liquid media used in the solder flux compositions described herein, and may, in some embodiments, serve as the carrier and/or the general solvent. Such polyols may include branched or straight chain alkylene polyols, such as, for example, ethylene, propylene, butylene, hexylene, isopropylene, isobutylene, and isopentylene polyols and polyvinyl alcohol. They may also include polyol esters, polyol ethers, and polyol ether esters, including, for example, diethylene glycol butyl ether acetate, tripropylene glycol methyl ether acetate, ethylene glycol phenyl ether acetate, polyvinylisobutyl ether, and diethylene glycol ethyl ether acetate.

Aliphatic dibasic esters may also be used in the solvent systems and liquid media employed in the solder flux compositions described herein. Suitable aliphatic dibasic esters include, for example, dimethyl adipate, dimethyl glutarate, dimethyl succinate, and combinations thereof.

Polyvinylalkylethers may also be used in the solvent systems and liquid media employed in the solder flux compositions described herein. Of these, those in which the alkyl group contains from 1–5 carbon atoms, such as polyvinylisobutylether, are especially preferred.

The solvent systems and liquid media employed in the solder flux compositions described herein may also include aliphatic carboxylic acid esters having low boiling points, including, for example, succinic acid dimethyl ester, or mixtures of succinic, glutaric and adipic acid dialkyl ester.

The solvent systems and liquid media employed in the solder flux compositions described herein may also include aliphatic, cyclic or cycloaliphatic ketones, including azacycloaliphatic (i.e., N-heterocyclic) ketones, cyclopentanone, cyclohexanone, N-methyl-2-pyrrolidone, acetone, and methyl ethyl ketone.

Additionally, the solvent systems and liquid media employed in the solder flux compositions described herein may also include aromatic or aliphatic hydrocarbons. The addition of a hydrocarbon may, in some cases, improve the electrical properties of the substrate and enhance the ease of removal of the solder flux composition from the device with non-polar solvents such as trichloroethane and perchloroethylene, if the use of such solvents is desired. Possible hydrocarbons include dixylyl ethane (1,1-di (orthoxylyl) ethane), natural oils such as squalane or squalene, mineral oil, and aromatic hydrocarbons such as, for example, toluene and xylene.

Of the various possible components described above, the solvent system or liquid medium used in the solder flux compositions described herein is preferably based on a mixture of polyethylene glycol with a polyalkylene glycol ether such as polypropylene glycol ether, polypropylene glycol butyl ether (PPGBE), polypropylene glycol monobutyl ether (PPGMBE), or tripropylene glycol n-butyl ether (TPGBE). The polyethylene glycol typically has an average molecular weight within the range of about 200 g/mol to about 4000 g/mol, preferably within the range of about 700 g/mol to about 1200 g/mol, and more preferably within the range of about 700 g/mol to about 1000 g/mol. Most preferably, the polyethylene glycol has an average molecular weight of about 900 g/mol. The polyalkylene glycol ether is preferably a polypropylene glycol ether, more preferably a polypropylene glycol monoalkyl ether, and most preferably a polypropylene glycol monobutyl ether.

In the solder flux compositions described herein which utilize a solvent system or liquid medium based on a mixture of polyethylene glycol with a polypropylene glycol ether, the amount of polyethylene glycol will typically range from about 5% to about 50%, preferably from about 10% to about 30%, and more preferably from about 10% to about 20%, based on the total weight of the solder flux composition. Most preferably, the amount of polyethylene glycol in the mixture will be about 15% by weight, based on the total weight of the solder flux composition. The amount of polypropylene glycol ether will typically range from about 10% to about 80%, preferably from about 30% to about 70%, and more preferably from about 50% to about 70%, based on the total weight of the solder flux composition. Most preferably, the amount of polypropylene glycol ether in the mixture will be about 62% by weight, based on the total weight of the solder flux composition.

In the solder flux compositions described herein which utilize a solvent system or liquid medium based on a mixture of a tripropylene glycol ether with a polypropylene glycol ether (such as, for example, a mixture of tripropylene glycol butyl ether with polypropylene glycol butyl ether), the amount of tripropylene glycol ether will typically range from about 25% to about 75%, preferably from about 35% to about 65%, and more preferably from about 40% to about 60%, based on the total weight of the solder flux composition. Most preferably, the amount of polyethylene glycol in the mixture will be about 50% by weight, based on the total weight of the solder flux composition. The amount of polypropylene glycol ether will typically range from about 5% to about 30%, preferably from about 10% to about 25%, and more preferably from about 15% to about 20%, based on the total weight of the solder flux composition. Most preferably, the amount of polypropylene glycol ether in the mixture will be about 17.5% by weight, based on the total weight of the solder flux composition.

Surfactants

In some embodiments of the solder flux compositions disclosed herein, it may be advantageous to include one or more surfactants in the composition. Such surfactants, which are preferably nonionic, include phenoxypolyethoxy ethanols; perfluoralkyl alcohols; glycol fatty acid esters such as glycerol monolaurate and ethylene glycol distearate; alkylaryl polyether alcohols; tertiary acetylenic glycols; ethoxylated polyoxypropylenes; alkoxylated phenols, such as alkoxylated bisphenols; mono-, di- or tri-alkyl or -aryl phosphate esters; keto fatty acids or ketone acids, such as levulinic acid, polycarboxylic acids; and mixtures of the foregoing.

Anticorrosion Agents and Complexing Agents

In some embodiments of the solder flux compositions disclosed herein, it may be advantageous to include one or more anticorrosion agents to prevent/minimize oxidation of the metals being soldered. Examples of possible anticorrosion agents include benzimidazole, benzotriazole and imidazole.

It may also be advantageous in some embodiments to employ a complexing agent, such as, for example, ethylamine or other simple amines, or a chelating agent, such as, for example, ethylene diamine tetra-acetic acid.

Rheology Promotors

The solder flux compositions described herein may also include one or more rheological property promotors or thixotropic agents for achieving a desired tackiness, viscosity or printability as may be needed for certain applications of the solder flux composition. These may include such materials as polyvinyl pyrrolidone, polyvinyl alcohol (PVA), starch, hydroxy ethyl cellulose gums such as arabic gum, tragacanth gum and xantan gum, beeswax, polyacrylic acid, polyacryl amide, ethyl cellulose, poly (ethylene-acrylic acid), and poly butene. Of these, beeswax and thixotropic agents such as PVA are especially useful for thickening the solder flux composition into a paste to facilitate its application to a substrate.

Masking Agents

Solder masking materials may be used advantageously in various applications of the solder flux compositions disclosed herein. Such materials may be used to protect PC boards, plated through-holes, contacts, pins, posts, terminals and gold fingers during soldering operations, and may also provide at least short-term high-temperature protection to a substrate from molten solder. In soldering operations involving various substrates, suitable solder masking materials may be disposed between adjacent bond pads where, in addition to protecting the substrate during solder reflow, they help to contain the active components of the solder flux composition in the vicinity of the bond pads.

Suitable solder masking materials suitable for use in applications of the solder flux compositions disclosed herein include, for example, polymeric materials derived from aprotic ammonium salt-containing moieties, possibly with the use of a photopolymerization initiator, a thermosetting compound (such as an amino resin, a cyclocarbonate compound, a blocked isocyanate compound, or an epoxy resin), and a diluent. Examples of these and other suitable solder masking materials are described, for example, in U.S. Pat. No. 5,217,847 (Varnell), U.S. Pat. No. 5,420,141 (Unruh), and U.S. Pat. No. 5,770,347(Saitoh et al.).

Commercially available solder mask materials suitable for use with the solder flux compositions described herein include those available commercially under the tradename Chemask® from Chemtronics (Kennesaw, Ga.), Probimer 52® and Probimer® 65M solder mask materials available commercially from Ciba Specialty Chemicals (Basel, Switzerland), SR8200R solder mask materials available commercially from Dexter Hysol Corporation (Olean, N.Y.), Tamura® DSR2200 liquid photoimageable solder masks available commercially from Kyocera (San Diego, Calif.), Taiyo PSR4000DM and Taiyo PSR4000MP solder mask materials available commercially from Taiyo Kogyo Corporation (Tokyo, Japan), and Enthone® DSR3241 MD solder mask materials, available commercially from Cookson Electronics, Inc. (West Haven, Conn.).

EXAMPLES

In the following examples, unless indicated otherwise, all percentages of the components of the solder flux compositions refer to the percent by weight of the component, based on the total weight of the solder flux composition. The following terms, which are referred to in the examples, have the meanings indicated:

J66W: A 1 inch×1 inch (2.54 cm×2.54 cm) medium-pitched substrate with a thickness of 1 mm, and equipped with bond pads having diameters of 0.6 mm. The bond pads have a pitch of 1.27 mm and a thickness of about 20 to 40 microns. Each substrate has a 19×19 array of bond pads which is depopulated in the center (that is, the substrate has a central 9×9 array which is devoid of solder bumps) and which has one solder ball position reserved for an identification pin in the A-1 position. Hence, the array has a total of 279 solder bumps.

J45R: A 3.9 cm×3.9 cm finer-pitched (1.0 mm) substrate having a 34×34 array of bond pads. The substrate is fully populated (except for the A-1 position, which is reserved for an identification pin) and hence has a total of 1155 solder bumps. The bond pads have a pitch of 1.0 mm.

PSA: Phenylsuccinic acid
EI: 2-ethylimidazole
PEG: polyethylene glycol
TPGBE: tripropylene glycol n-butylether
PPGBE: poly(propylene glycol) butylether
PPGMBE: poly(propylene glycol) monobutylether
PG: propylene glycol
PVA: polyvinyl alcohol
OSP: Organic Solder Preservative (typically benzotriazole-based or substituted immidizole-based)

Wax: Unless otherwise indicated, beeswax was used as the wax component in the solder flux compositions of the examples.

Example 1

This example illustrates the preparation of a solder flux composition in accordance with the teachings herein which undergoes a phase separation under typical reflow conditions.

Phenylsuccinic acid (PSA) (98% by weight) and 2-ethylimidazole (EI) (98% by weight) were combined in a beaker. The beaker was placed on a hot plate and was stirred until the PSA and EI reacted. Next, the following ingredients were added to the beaker: poly(ethylene glycol) having an average molecular weight of 900 g/mol (PEG-900); beeswax; and poly(propylene glycol) monobutylether (PPGMBE). The mixture was heated with mixing until it assumed a single phase, taking care to maintain the temperature of the mixture below 200° C. and to prevent the mixture from bubbling. The percentages by weight of the components of the final mixture are listed in TABLE 1 as EXAMPLE E-1.

Example 2

This example illustrates the preparation of another solder flux composition in accordance with the teachings herein which undergoes a phase separation under typical reflow conditions.

Using the general methodology of EXAMPLE 1, a second solder flux composition was prepared using the ingredients and amounts set forth in TABLE 1 as EXAMPLE E-2.

Example 3–18

These examples illustrate the preparation of several solder flux similar in some respects to, but are different from, solder flux compositions E-1 and E-2. These solder flux compositions are used for comparative purposes in some of the subsequent examples.

Using the general methodology of EXAMPLE 1, a series of solder flux compositions were prepared using the ingredients and amounts set forth in TABLE 1 as EXAMPLES E-3 to E-18.

TABLE 1

| | Solder Flux Composition Ingredients (in weight %) | | | | | | | | |
|---|---|---|---|---|---|---|---|---|---|
| | Solder Flux | Masking Agent | Carrier PEG | | Solvent | | | Agent | |
| EXAMPLE | PSA | EI | MW = 0.9K | MW = 10K | TPGBE | PPGBE | PG | Wax | PVA |
| E-1 | 15.3 | 3.8 | 15.3 | — | — | 61.8 | — | 3.8 | — |
| E-2 | 10.0 | 5.0 | — | 3.5 | 50.0 | 17.5 | — | 14.0 | — |
| E-3 | 2 | — | 16.3 | 16.3 | 65.3 | — | — | — | — |
| E-4 | 7.7 | — | 15.4 | 15.4 | 61.5 | — | — | — | — |
| E-5 | 11.1 | — | 14.8 | 14.8 | 59.3 | — | — | — | — |
| E-6 | 17.2 | — | 13.8 | 13.8 | 55.2 | — | — | — | — |
| E-7 | — | — | 6.4 | 3.2 | 82.4 | — | — | 8 | — |
| E-8 | 2 | — | 6.4 | 3.2 | 80.4 | — | — | 8 | — |
| E-9 | 5 | — | 6.4 | 3.2 | 77.4 | — | — | 8 | — |
| E-10 | 10 | — | 6.4 | 3.2 | 72.4 | — | — | 8 | — |
| E-11 | — | — | — | 3.6 | — | — | 89.3 | — | 7.1 |
| E-12 | 2.2 | — | — | 4.3 | — | — | 85 | — | 8.5 |
| E-13 | 10.8 | 5.4 | — | 3.5 | 50 | 17.5 | — | 14.0 | — |
| E-14 | 8.8 | 4.4 | — | 4.3 | — | 61.3 | — | 21.2 | — |
| E-15 | 8 | 4 | 4 | — | — | 74 | — | 10 | — |
| E-16 | 8.3 | 4.2 | — | — | — | 77.1 | — | 10.4 | — |

TABLE 1-continued

Solder Flux Composition Ingredients (in weight %)

| EXAMPLE | Solder Flux PSA | Masking Agent EI | Carrier PEG | | Solvent | | Agent | |
| | | | MW = 0.9K | MW = 10K | TPGBE | PPGBE | PG | Wax | PVA |
|---|---|---|---|---|---|---|---|---|---|
| E-17 | 12.8 | 6.4 | 8.5 | — | — | 63.8 | — | 8.5 | — |
| E-18 | 10.5 | 5.3 | 14 | — | — | 70.2 | — | — | — |

Example 19

This example illustrates the phase separation under reflow conditions that can occur with some of the solder flux compositions made in accordance with the teachings herein.

The solder flux composition of EXAMPLE 1 was placed into a test tube and was heated to above 200° C. By way of comparison, $Sn_{95.5}Ag_4Cu_{0.5}$ solder can be reflowed at temperatures within the range of 230–260° C. The solder flux composition was observed to undergo a phase separation into an upper and lower phase. Subsequent analysis showed that the upper phase consisted primarily of carrier (PEG) and that the active ingredients of the solder flux composition (the PSA) remained predominantly in the lower phase.

Examples 20–36

These examples illustrate the performance of the solder flux composition of EXAMPLE 1 (E-1 in TABLE 1) on a medium pitch substrate at various reflow temperatures using a lead-free solder composition.

The solder flux composition E-1 was stencil printed, using the general methodology depicted in FIGS. 3–5, at a thickness of about 3 mils (0.0076 cm) onto a series of identical J66W 1/2/1 substrates obtained commercially from NTK Technologies, Inc. (Santa Clara, Calif.). The stencil utilized was a stainless steel mesh with an aperture size of about 0.028 inches (0.071 cm).

After application of the solder flux composition, solder spheres having an average diameter of 30 mil (0.076 cm) and comprising $Sn_{95.5}Ag_4Cu_{0.5}$ were applied to the treated surfaces by a ball drop method. The solder spheres were then reflowed in a furnace at the peak reflow temperatures listed in TABLE 2.

After reflow, the number of defective substrates were counted. For the purposes of these examples, a substrate having at least one defective solder bump after reflow was recorded as a reject, regardless of the number of defective or acceptable solder bumps otherwise present on the die. Hence, only dice having 279 acceptable solder bumps were recorded as being non-defective.

In each of EXAMPLES 20–36, a 100% yield was obtained. In each case, the solder flux composition exhibited good wetting properties, and no bridging was observed. These results, which demonstrate the usefulness of the solder flux compositions described herein in solder operations (especially those involving lead-free solders), are particularly impressive in that no attempt was made to optimize the results.

TABLE 2

Yield at Reflow Temperatures

| EXAMPLE | Reflow Temperature (° C.) | Solder Flux Composition | Yield (%) |
|---|---|---|---|
| E-20 | 235 | E-1 | 100 |
| E-21 | 235 | E-1 | 100 |
| E-22 | 235 | E-1 | 100 |
| E-23 | 235 | E-1 | 100 |
| E-24 | 235 | E-1 | 100 |
| E-25 | 235 | E-1 | 100 |
| E-26 | 235 | E-1 | 100 |
| E-27 | 260 | E-1 | 100 |
| E-28 | 260 | E-1 | 100 |
| E-29 | 260 | E-1 | 100 |
| E-30 | 260 | E-1 | 100 |
| E-31 | 260 | E-1 | 100 |
| E-32 | 230 | E-1 | 100 |
| E-33 | 230 | E-1 | 100 |
| E-34 | 260 | E-1 | 100 |
| E-35 | 260 | E-1 | 100 |
| E-36 | 260 | E-1 | 100 |
| E-37 | 235 | E-3 | 0 |
| E-38 | 235 | E-4 | 0 |
| E-39 | 235 | E-5 | 0 |
| E-40 | 235 | E-6 | 0 |
| E-41 | 235 | E-7 | 0 |
| E-42 | 235 | E-8 | 0 |
| E-43 | 235 | E-9 | 0 |
| E-44 | 235 | E-10 | 0 |
| E-45 | 235 | E-11 | 0 |
| E-46 | 235 | E-12 | 0 |
| E-47 | 250 | TACFLUX ® 014 | 0 |
| E-48 | 250 | TACFLUX ® 014 | 40 |
| E-49 | 250 | E-14 | 0 |

Examples 37–46

These examples illustrate the bridging problems encountered with many solder flux compositions in lead-free solder applications, illustrated here on a medium-pitched substrate.

Following the methodology of EXAMPLES 20–36 and using the same medium-pitched substrate, the solder flux compositions set forth as EXAMPLES E-3 to E-12 in TABLE 1 were used in ball attach operations as EXAMPLES 37–46 followed by solder reflow. The yield results are set forth in TABLE 2.

As seen from TABLE 2, in each case, substantial bridging was observed during solder reflow, and a 0% yield was obtained.

Examples 47–49

These examples illustrate the bridging problems encountered with many solder flux compositions in lead-free solder applications, illustrated here on a medium-pitched substrate.

Using the general methodology and substrate of EXAMPLES 20–36, the efficacy of two different solder flux compositions in a lead-free soldering process was explored. In both cases, the reflow profile was set with a peak temperature of 250° C. The results are set forth in TABLE 2.

In EXAMPLE 47, four substrates from a first product lot were prepared for sphere placement and reflow using TAC-FLUX® 014, a high viscosity solder flux composition available commercially from Indium Corporation (Utica, N.Y.).

In EXAMPLE 48, EXAMPLE 37 was repeated on five substrates from a second product lot.

In EXAMPLE 49, two substrates were prepared for sphere placement and reflow using the solder flux composition set forth in TABLE 1 as E-38.

In EXAMPLE 47, all four substrates exhibited bridging problems, and a 0% yield was obtained.

In EXAMPLE 48, two of the substrates were acceptable and the other three exhibited bridging and robbing problems. Accordingly, the yield was 40%.

In EXAMPLE 49, bridging and poor wetting were observed, and the product yield was 0%.

Examples 50–53

These examples demonstrate the bridging problems encountered with many solder flux compositions in lead-free solder applications, illustrated here on a medium-pitched substrate and with various stencil sizes.

Using the general methodology and substrate of EXAMPLES 20–36, the efficacy of three different solder flux compositions in a lead-free soldering process was explored.

In EXAMPLE 50, five substrates were prepared for sphere placement and reflow using the solder flux composition set forth in TABLE 1 as E39. Of these, two of the substrates were prepared using a 0.3 mil (7.62 microns) solder flux stencil and were reflowed at 260° C., two were prepared using a 0.6 mil (15.24 microns) solder flux stencil and were reflowed at 260° C.; and one was prepared using a 0.6 mil (15.24 microns) solder flux stencil and was reflowed at 250° C. In each case, substantial bridging was observed, and the yield was 0%.

In EXAMPLE 51, four substrates were prepared for sphere placement and reflow using the solder flux composition set forth in TABLE 1 as E-40. Of these, two of the substrates were prepared using a 0.3 mil (7.62 microns) solder flux stencil and were reflowed at 250° C., and two were prepared using a 0.6 mil (15.24 microns) solder flux stencil and were reflowed at 250° C. In each case, substantial bridging was observed (the substrates prepared with the 0.6 mil (15.24 microns) solder flux stencil was particularly bad) and the yield was 0%.

In EXAMPLE 52, nine substrates were prepared for sphere placement and reflow using the solder flux composition set forth in TABLE 1 as E17. Of these, two of the substrates were prepared using a 0.3 mil (7.62 microns) solder flux stencil and were reflowed at 250° C., giving a yield of 50%. Two of the substrates were prepared using a 0.6 mil (15.24 microns) solder flux stencil and were reflowed at 250° C., giving a yield of 0%. Five substrates were prepared using a 0.3 mil (7.62 microns) solder flux stencil and were reflowed at 235° C., giving a yield of 40%.

In EXAMPLE 53, two substrates were prepared for sphere placement and reflow using the solder flux composition set forth in TABLE 1 as C12. Both substrates were prepared using a 0.3 mil (7.62 microns) solder flux stencil and were reflowed at 235° C. In each case, substantial bridging was observed and the yield was 0%.

Examples 54–62

These examples illustrate the performance of the solder flux composition of EXAMPLE 1 (E-1 in TABLE 1) on various medium pitch substrates with various surface finishes and using a lead-free solder composition.

Using the general methodology of EXAMPLES 20–36, nine additional examples were run using solder flux composition E-1 on various substrates (the first six are identical but are taken from different lots). The substrates are identified in TABLE 3.

TABLE 3

Solder Reflow Results on Various Substrates

| Example | Manufacturer | Test Vehicle | Surface Finish | Solder Mask | Results |
| --- | --- | --- | --- | --- | --- |
| E-54 | Kyocera[1] | J66W | NiAu | DSR 2200 | No Bridging; 100% Yield |
| E-55 | Kyocera[1] | J66W | NiAu | DSR 2200 | No Bridging; 100% Yield |
| E-56 | Kyocera[2] | J66W | NiAu | DSR 2200 | No Bridging; 100% Yield |
| E-57 | Kyocera[2] | J66W | NiAu | DSR 2200 | No Bridging; 100% Yield |
| E-58 | Kyocera[3] | J66W | NiAu | DSR 2200 | No Bridging; 100% Yield |
| E-59 | Kyocera[3] | J66W | NiAu | DSR 2200 | No Bridging; 100% Yield |
| E-60 | Kyocera | J66W | OSP | DSR 2200 | No Bridging; 100% Yield |
| E-61 | Kyocera | 366W | OSP | DSR 2200 | No Bridging; 100% Yield |
| E-62 | NTK | J66W | NiAu | NIA | No Bridging; 100% Yield |

[1]Samples from first lot
[2]Samples from second lot
[3]Samples from third lot

As seen from the results in TABLE 3, 100% yield was obtained with the use of solder flux composition E-1 on each of the medium-pitched substrates disclosed therein. In particular, the solder flux composition performed equally well on substrates having both NiAu and OSP surface finishes. These results demonstrate the ability of the solders disclosed herein to work on various substrates.

Examples 63–66

These examples illustrate the use of the solder flux composition of EXAMPLE 1 on finer pitched substrates and in conjunction with a lead-free solder composition.

The solder flux composition of EXAMPLE 1 was applied to four different J45R substrates, each having a pitch of about 1.0 mm. Each substrate had 1155 copper I/O pads with an Organic Solder Preservative (OSP) surface finish. A solder flux stencil (manufactured by Photo Stencil, Inc., Colorado Springs, Colo.) was used to apply the solder flux composition to the four substrates.

The solder used was a $Sn_{62}Pb_{36}Ag_2$ alloy provided as spheres having an average diameter of about 0.025 inches (0.635 mm). The solder was reflowed using a eutectic profile at a peak temperature of 219° C., a time above liquidus of between 60 and 80 seconds, and a soak between 150–180° C. of about 45 seconds, and the number of bridges (if any) present on the sample were recorded. The results are set forth in TABLE 4 as EXAMPLES E-63 to E-66.

As the results of TABLE 4 indicate, the products of EXAMPLES 64–66 were free of defects, while the product of EXAMPLE 63 had two bridges. These examples illustrate the effectiveness of the solder flux compositions described herein in a ball attach operation of the type involved in the manufacture of BGA packages. These examples also demonstrate the superiority of these solder flux compositions over existing solder flux compositions. As with EXAMPLES 20–36, no attempt was made to optimize these results or the various process parameters involved (e.g., print speed and squeegee pressure). Even so, however, the results demonstrate the suitability of the solder flux compositions described herein in solder operations involving finer pitched substrates having small features.

TABLE 4

Substrate Descriptions

| EXAMPLE | Manufacturer | Test Vehicle | Surface Finish | Solder Mask | Results |
|---|---|---|---|---|---|
| E-63 | NTK | J45R FR1 | Special | OSP | 2 bridges |
| E-64 | Kyocera | J45R AV | Tamura DSR 2200 | OSP | No bridges |
| E-65 | Fujitsu | J45R FR1 | Hitachi SR7000 | OSP | No bridges |
| E-66 | NTK | J45R FR1 | Special | OSP | No bridges |

Examples 67–77

These examples illustrate the application of the solder flux composition of EXAMPLE 2 on fine pitch and lead-free substrates.

Using the general methodology and substrate of EXAMPLES 63–66, the efficacy of the solder flux composition of EXAMPLE 2 was investigated.

In EXAMPLE 67, a J45R substrate (fine-pitched) was printed with the solder flux composition E-2 and subsequently cleaned with isopropyl alcohol (IPA) prior to re-application of the solder flux composition, and the eutectic solder (SnPbAg) was reflowed at 219° C. No bridging was observed (i.e., the yield was 100%).

In EXAMPLES 68–71, a J45R substrate (fine-pitched) was used, and the solder was reflowed at 219° C. The yield was 100%, and the solder exhibited good wetting properties.

In EXAMPLES 72–74, a J66W substrate (medium-pitched) was used with a lead-free solder. The solder was reflowed at 260° C. Wetting was good, and the yield was 100%.

In EXAMPLES 75–77, a J66W substrate (medium-pitched) was used in conjunction with a lead-free solder. The solder was reflowed at 235° C. The yield was 60%, and the solder exhibited diminished wetting problems compared to EXAMPLES 72–74.

As shown by these examples, the solder flux composition of EXAMPLE 2 is well adapted for use on fine-pitched substrates at certain reflow temperatures. The lower yield in EXAMPLES 75–77 and noted decrease in wetting suggests a possible decrease in the efficacy of the solder at the lower end of the reflow range.

Examples 78–79

These examples illustrate the comparative results achieved with some of the solder flux compositions described in TABLE 1 on finer pitched substrates.

Using the general methodology and lead-free solder of EXAMPLES 20–36, the solder flux compositions E-11 and E-12 from TABLE 1 were applied to a J45R FR-1 NTK substrate having a pitch of 1.0 mm. The solder flux compositions lacked the tackiness characteristic of most solder flux compositions. Both solder flux compositions had wetting problems, and the solder spheres did not adhere to them very well or to the substrate. The yield in each case was 0%.

Examples 80–90

These examples illustrate the application of the solder flux composition of EXAMPLE 1 to a variety of different finer-pitched substrate types employing various solder masks in conjunction with a lead-free solder.

Using the general methodology of EXAMPLES 20–36, the solder flux composition of EXAMPLE 1 was applied to one each of the J45R substrates set forth in TABLE 4 as EXAMPLES E-80 to E-90. The solder exhibited good wetting and no bridging was observed (100% yield), thus demonstrating the flexibility of this solder flux composition on a variety of substrates.

TABLE 5

Substrate Descriptions

| EXAMPLE | Manufacturer | Substrate Type | Surface Finish | Solder Mask | Results |
|---|---|---|---|---|---|
| E-80 | Kyocera | J45R-AV | OSP | Tamura DSR 2200 | No bridges |
| E-81 | Kyocera | J45R-AV | OSP | Tamura DSR 2200 | No bridges |
| E-82 | NTK | J45R-FR1 | OSP | Special | No bridges |
| E-83 | AT&S | J45R-FR1 | OSP | Probimer 65 | No bridges |
| E-84 | NTK | J45R-FR1 | OSP | Special | No bridges |

TABLE 5-continued

| | | Substrate Descriptions | | | |
|---|---|---|---|---|---|
| EXAMPLE | Manufacturer | Substrate Type | Surface Finish | Solder Mask | Results |
| E-85 | Kyocera | J45R-FR1 | OSP | Tamura DSR 2200 | No bridges |
| E-86 | Kyocera | J45R-AV | OSP | Tamura DSR 2200 | No bridges |
| E-87 | Kyocera | J45R-FR1 | OSP | Tamura DSR 2200 | No bridges |
| E-88 | Kyocera | J45R-FR1 | OSP | Tamura DSR 2200 | No bridges |
| E-89 | Kyocera | J45R-FR1 | OSP | Tamura DSR 2200 | No bridges |
| E-90 | NTK | J45R-FR1 | OSP | Special | No bridges |

Examples 91–96

These examples illustrate the variations in yield often observed with existing solder flux compositions from one assembly lot to the next in the manufacture of BGAs using a lead-based solder on a finer-pitched substrate.

Six different assembly lots of BGA products were made using Indium Tac014 solder flux composition in conjunction with a SnPbAg solder. The substrate, supplier, finish, solder mask, quantity in and out, and yield are all as indicated in TABLE 6.

As the results in TABLE 6 show, the yield obtained in some of the product lots was decent (e.g., E-91, E-92 and E-93), while in others (E-94, E-95 and E-96) it was quite poor. The mean yield for these lots was about 86%, which is lower than desired for a commercial process.

Examples 97–109

These examples illustrate the use of solder flux compositions made in accordance with the teachings herein in conjunction with a variety of different substrates and using both lead-free and lead-based solders.

Several lots of BGAs were produced using the solders, solder masks, substrate types, makes, and finishes set forth in TABLE 6. The yield after reflow was recorded for each case as EXAMPLES E-97 to E-109 of TABLE 6.

As seen from the results in TABLE 6, the solder flux compositions made in accordance with the teachings herein exhibited excellent yields with each of the substrates tested. These solder flux compositions were also effective with both lead-based (SnPbAg) and lead-free (SnAgCu) solders.

TABLE 6

| | | Substrate Descriptions | | | | | | | |
|---|---|---|---|---|---|---|---|---|---|
| EXAMPLE | Solder Flux Composition | Substrate Type | Supplier | Surface Finish | Solder Mask | Quantity In | Quantity Out | Yield | Solder |
| E-91 | Indium Tac014 | J45R-AV | Kyocera | OSP | Tamura DSR2200 | 32 | 30 | 94 | SnPbAg |
| E-92 | Indium Tac014 | J45R-AV | Kyocera | OSP | Tamura DSR2200 | 150 | 142 | 95 | SnPbAg |
| E-93 | Indium Tac014 | J45R-AV | Kyocera | OSP | Tamura DSR2200 | 146 | 137 | 94 | SnPbAg |
| E-94 | Indium Tac014 | J45R-AV | Kyocera | OSP | Tamura DSR2200 | 142 | 103 | 73 | SnPbAg |
| E-95 | Indium Tac014 | J45R-AV | Kyocera | OSP | Tamura DSR2200 | 150 | 123 | 82 | SnPbAg |
| E-96 | Indium Tac014 | J45R-AV | Kyocera | OSP | Tamura DSR2200 | 101 | 85 | 84 | SnPbAg |
| E-97 | E-1 | J-66W | NTK | OSP | N/A | 60 | 60 | 100 | SnAgCu |
| E-98 | E-1 | J-66W | NTK | NiAu | N/A | 46 | 45 | 98 | SnAgCu |
| E-99 | E-1 | J-66W | NTK | NiAu | N/A | 10 | 10 | 100 | SnAgCu |
| E-100 | E-1 | J-66W | Kyocera | NiAu | Tamura DSR2200 | 10 | 10 | 100 | SnAgCu |
| E-101 | E-1 | J-66W | NTK | OSP | N/A | 80 | 80 | 100 | SnAgCu |
| E-102 | E-1 | J-66W | NTK | NiAu | N/A | 79 | 79 | 100 | SnPbAg |
| E-103 | E-1 | J-66W | NTK | NiAu | N/A | 160 | 158 | 99 | SnAgCu |
| E-104 | E-1 | J-13S | Ibiden | NiAu | S-50 | 96 | 96 | 100 | SnPbAg |
| E-105 | E-1 | J-66W | Kyocera | NiAu | Tamura DSR2200 | 108 | 108 | 100 | SnAgCu |
| E-106 | E-1 | J-66W | NTK | NiAu | N/A | 20 | 20 | 100 | SnAgCu |
| E-107 | E-2 | J-13S | Ibiden | NiAu | S-50 | 95 | 94 | 99 | SnPbAg |
| E-108 | E-2 | J-13S | Ibiden | NiAu | N/A | 96 | 95 | 100 | SnPbAg |
| E-109 | E-2 | J-45R FRI | NTK | OSP | Special | 157 | 150 | 96 | SnPbAg |

Examples 110–114

These examples illustrate the performance of a commercially available solder flux compositions on various medium-pitched substrates and using a lead-free solder.

A sample of the solder flux composition WS600 was obtained commercially from Alpha Metals, Inc. (Jersey City, N.J.) and was tested on the various J66W substrates (medium-pitched) set forth in TABLE 7 in conjunction with a lead-free solder ($Sn^{95.5}Ag_4Cu_{0.5}$). The solder was reflowed in a Paragon® reflow oven at a peak reflow temperature of approximately 240° C.

TABLE 7

WS600 Solder Flux Composition Test Data

| EXAMPLE | Manufacturer | Test Vehicle | Finish | Solder Mask | Quantity | Yield (%) |
|---------|--------------|--------------|--------|-------------|----------|-----------|
| E-110 | Kyocera | J66W | OSP | Tamura DSR2200 | 3 | 100 |
| E-111 | Kyocera | J66W | NiAu | Tamura DSR2200 | 3 | 33 |
| E-112 | NTK | J66W | NiAu | N/A | 3 | 0 |
| E-113 | NTK | J66W | NiAu | N/A | 2 | 0 |
| E-114 | NTK | J66W | NiAu | N/A | 2 | 0 |

As the results of these examples show, the WS600 solder flux composition was found to work well only on the OSP finished J66W Kyocera substrate. By contrast, a 33% yield was obtained with the same substrate but having a NiAu finish. A 0% yield was obtained on all of the other substrates tested.

A solder flux composition, and a method of applying a solder flux composition to a substrate, has been provided herein that can be used for ball attach on BGA substrates and in other soldering operations. The solder flux composition is found to undergo phase separation during solder reflow to form at least a first phase and a second phase such that the solder flux is disposed primarily in the first phase and the carrier is disposed primarily in the second phase. The use of this solder flux composition is found to reduce solder migration that can result in bridging in ball grid arrays and other such devices.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A method for reflowing solder, comprising the steps of:
providing a substrate;
applying to the substrate a solder flux composition comprising active ingredients disposed in a carrier, thereby forming a treated substrate;
applying solder to the treated substrate; and
reflowing the solder;
wherein the solder flux composition undergoes a phase separation during the reflow of the solder composition to produce a first liquid phase which consists principally of the carrier and a second phase which consists principally of the active ingredients of the solder flux composition.

2. The method of claim 1, wherein the solder flux composition contains a single phase when it is applied to the substrate.

3. The method of claim 1, wherein the substrate comprises a plurality of bond pads, and wherein the solder flux composition is selectively applied to the substrate with the aid of a stencil such that the composition is disposed primarily over said plurality of bond pads.

4. The method of claim 3, wherein at least two of the plurality of bond pads have a solder mask disposed between them.

5. The method of claim 1, wherein the step of reflowing the solder involves heating the solder to a temperature greater than 200° C.

6. The method of claim 1, wherein the solder flux composition comprises a carboxylic acid, a masking agent, a carrier, and a solvent.

7. The method of claim 6, wherein the carboxylic acid is phenylsuccinic acid.

8. The method of claim 6, wherein the masking agent comprises 2-ethylimidazole.

9. The method of claim 6, wherein the carrier comprises polyethylene glycol.

10. The method of claim 6, wherein the solvent comprises a polypropylene glycol butyl ether.

11. The method of claim 6, wherein the solvent comprises tripropylene glycol n-butyl ether.

12. The method of claim 1, wherein the substrate is a ball grid array substrate.

13. The method of claim 1, wherein the substrate has a plurality of bond pads disposed thereon having a pitch of less than about 1.0 mm and wherein, after reflow, the solder forms a ball grid array in which each solder ball is disposed over one of said plurality of bond pads.

14. A method for treating surfaces of bond pads prior to solder application, comprising the steps of:
providing a substrate having a plurality of bond pads thereon;
treating the bond pads with a solder flux composition comprising
(a) phenylsuccinic acid,
(b) ethylimidazole,
(c) polyethylene glycol,
(d) at least one alkylene glycol butyl ether, and
(e) a thixotropic agent,
wherein the amount of ethylimidazole present in the solder flux composition is less than 5.4% by weight, based on the total weight of the solder flux composition; and
applying solder to the treated bond pads.

15. The method of claim 14, wherein the solder flux composition comprises:
about 2 to about 20% phenylsuccinic acid;
about 2.0 to about 5.2% ethylimidazole;
about 1 to about 20% polyethylene glycol;
about 50 to about 80% of at least one alkylene glycol butyl ether; and
about 2 to about 20% thixotropic agent; ps wherein all percentages are percentages by weight, based on the total weight of the solder flux composition.

16. The method of claim 14, wherein the solder flux composition comprises:
   about 8 to about 16% phenylsuccinic acid;
   about 3.5 to about 5.1% ethylimidazole;
   about 3 to about 16% polyethylene glycol;
   about 60 to about 70% of at least one alkylene glycol butyl ether; and
   about 3 to about 15% thixotropic agent;
wherein all percentages are percentages by weight, based on the total weight of the solder flux composition.

17. The method of claim 14, wherein the substrate is a ball grid array substrate.

18. The method of claim 14, wherein the solder is reflowed, and wherein the solder flux composition undergoes a phase separation during the reflow of the solder.

19. A solder flux composition, comprising:
   an organic acid; and
   a carrier;
wherein the solder flux composition undergoes a phase separation at a temperature greater than about 100° C. to form at least a first phase and a second phase, wherein the organic acid is disposed primarily in said first phase, and wherein the carrier is disposed primarily in said second phase.

20. The solder flux composition of claim 19; wherein the solder flux composition comprises a carboxylic acid, a masking agent, a carrier, and a solvent.

21. The solder flux composition of claim 20, wherein the carboxylic acid is phenylsuccinic acid.

22. The solder flux composition of claim 20, wherein the masking agent comprises 2-ethylimidazole.

23. The solder flux composition of claim 19, wherein the carrier comprises polyethylene glycol.

24. The solder flux composition of claim 19, wherein the solvent comprises a polypropylene glycol butyl ether.

25. The solder flux composition of claim 19, wherein the solvent comprises tripropylene glycol n-butyl ether (TPGBE).

26. A solder flux composition, comprising:
   phenylsuccinic acid;
   ethylimidazole;
   polyethylene glycol;
   at least one alkylene glycol butyl ether; and
   a thixotropic agent;
wherein the amount of ethylimidazole present in the solder flux composition is less than 5.4% by weight, based on the total weight of the solder flux composition.

27. The solder flux composition of claim 26, comprising:
   about 2 to about 20% phenylsuccinic acid;
   about 2.0 to about 5.2% ethylimidazole;
   about 1 to about 20% polyethylene glycol;
   about 50 to about 80% of at least one alkylene glycol butyl ether; and
   about 2 to about 20% thixotropic agent;
wherein all percentages are percentages by weight, based on the total weight of the solder flux composition.

28. The solder flux composition of claim 26, comprising:
   about 8 to about 16% phenylsuccinic acid;
   about 3.5 to about 5.1% ethylimidazole;
   about 3 to about 16% polyethylene glycol;
   about 60 to about 70% of at least one alkylene glycol butyl ether; and
   about 3 to about 15% thixotropic agent;
wherein all percentages are percentages by weight, based on the total weight of the solder flux composition.

29. The solder flux composition of claim 26, wherein said at least one alkylene glycol butyl ether comprises polypropylene glycol butyl ether and tripropylene glycol butyl ether.

30. The solder flux composition of claim 26, wherein the amount of ethylimidazole present in the solder flux composition is within the range of about 2.0 to about 5.2% by weight, based on the total weight of the solder flux composition.

31. The solder flux composition of claim 26, wherein the amount of ethylimidazole present in the solder flux composition is within the range of about 3.5 to about 5.1% by weight, based on the total weight of the solder flux composition.

32. The solder flux composition of claim 26, wherein the amount of phenylsuccinic acid present in the solder flux composition is within the range of about 2 to about 20% by weight, based on the total weight of the solder flux composition.

33. The solder flux composition of claim 26, wherein the amount of phenylsuccinic acid present in the solder flux composition is within the range of about 8 to about 16% by weight, based on the total weight of the solder flux composition.

34. The solder flux composition of claim 26, wherein the amount of polyethylene glycol present in the solder flux composition is within the range of about 1 to about 20% by weight, based on the total weight of the solder flux composition.

35. The solder flux composition of claim 26, wherein the amount of thixotropic agent present in the solder flux composition is within the range of about 2 to about 20% by weight, based on the total weight of the solder flux composition.

36. The solder flux composition of claim 26, wherein the amount of said at least one alkylene glycol butyl ether is within the range of about 50 to about 80% by weight, based on the total weight of the solder flux composition.

37. A method for reflowing solder, comprising the steps of:
   providing a substrate;
   applying to the substrate a solder flux composition comprising active ingredients disposed in a carrier, thereby forming a treated substrate;
   applying solder to the treated substrate; and
   reflowing the solder;
wherein the solder flux composition comprises phenylsuccinic acid, a masking agent, a carrier, and a solvent.

* * * * *